United States Patent
Lee et al.

(10) Patent No.: US 6,486,100 B1
(45) Date of Patent: Nov. 26, 2002

(54) METHOD FOR PREPARING PREFERENTIALLY ORIENTED, HIGH TEMPERATURE SUPERCONDUCTORS USING SOLUTION REAGENTS

(75) Inventors: Dominic F. Lee, Knoxville, TN (US); Donald M. Kroeger, Knoxville, TN (US); Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/736,035

(22) Filed: Dec. 13, 2000

Related U.S. Application Data

(63) Continuation of application No. 08/931,631, filed on Sep. 16, 1997, now Pat. No. 6,256,521.

(51) Int. Cl.[7] ............................................. C30B 25/18
(52) U.S. Cl. ................ 505/470; 505/700; 148/5.2; 148/525; 148/537
(58) Field of Search .................. 148/5.2, 525, 537; 505/470, 500

(56) References Cited

U.S. PATENT DOCUMENTS 5,741,377 A * 4/1998 Goyal et al. ............... 148/512

FOREIGN PATENT DOCUMENTS

| JP | 06-316495 | * 4/1993 | |
|---|---|---|---|
| WO | 32201 | * 10/1996 | 505/500 |

* cited by examiner

*Primary Examiner*—Robert Kunemund
(74) *Attorney, Agent, or Firm*—Akerman, Senterfitt & Edison, P.A.

(57) ABSTRACT

A multi-domained bulk $REBa_2CU_3O_x$ with low-angle domain boundaries which resemble a quasi-single domained material and a method for producing the same comprising arranging multiple seeds, which can be small single crystals, single domained melt-textured $REBa_2CU_3O_x$ pieces, textured substrates comprises of grains with low misorientation angles, or thick film $REBa_2CU_3O_x$ deposited on such textured substrate, such seeds being tailored for various $REBa_2CU_3O_x$ compounds, in specific pattern and relative seed orientations on a superconductor precursor material which may be placed in contact with a porous substrate so as to reduce the amount of liquid phase in the melt. Because seeds can be arranged in virtually any pattern, high quality $REBa_2CU_3O_x$ elements of virtually unlimited size and complex geometry can be fabricated.

18 Claims, 12 Drawing Sheets

FLYWHEEL BEARINGS

RING MAGNETS

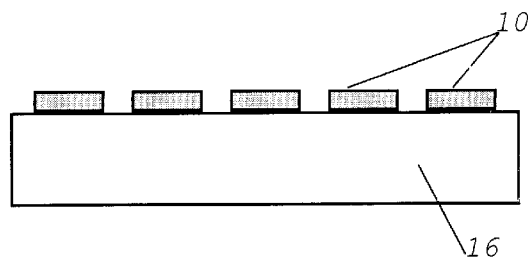
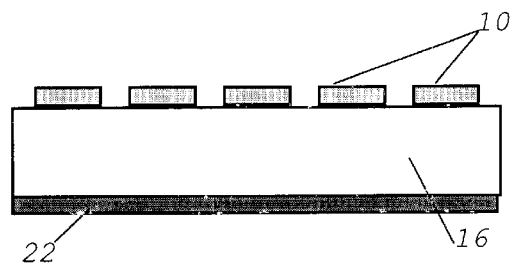
*FIG. 5a*　　　　　　　*FIG. 5b*
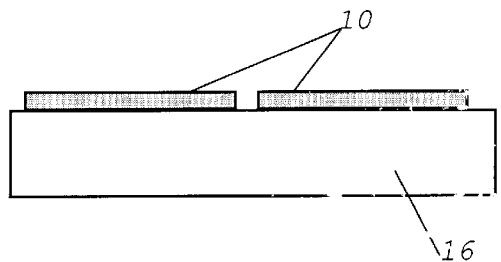
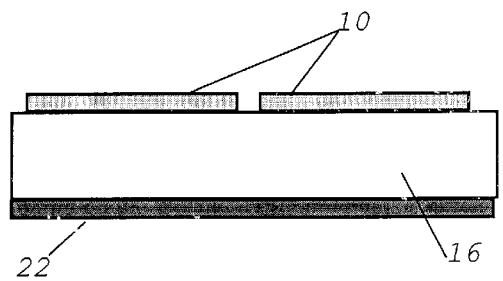
*FIG. 5c*　　　　　　　*FIG. 5d*
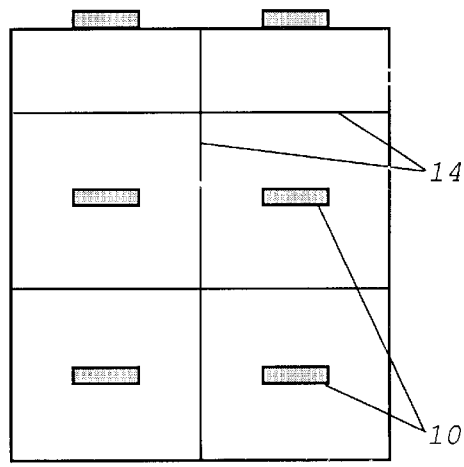
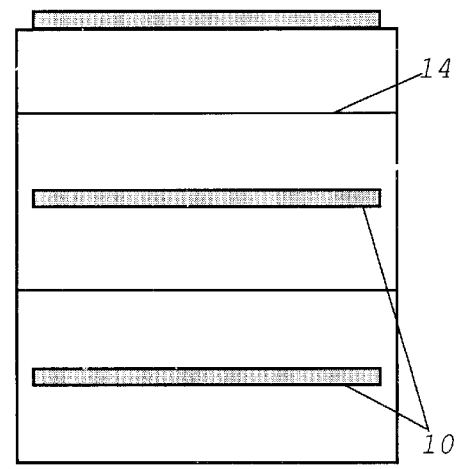
*FIG. 6a*　　　　　　　*FIG. 6b*

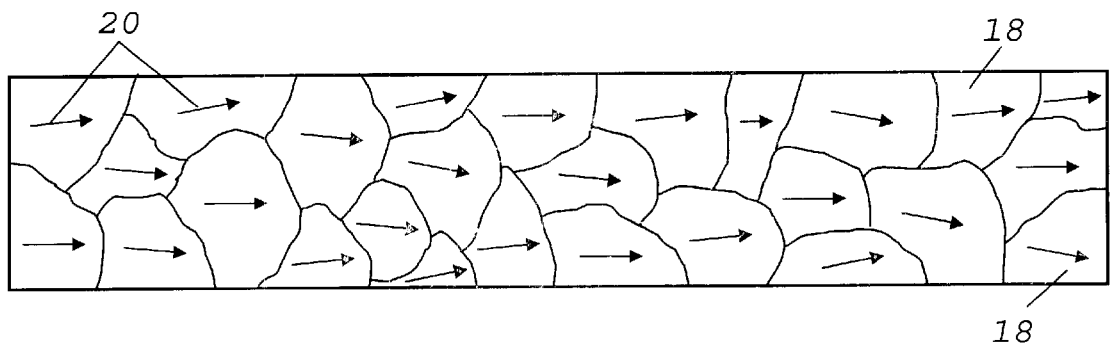
 GRAIN IN METALLIC SUBSTRATE OR METALLIC BUFFER LAYER, COLONY OF CERAMIC BUFFER LAYER, OR COLONY OF DEPOSITED $REBa_2Cu_3O_x$
▸ (100) AXIS OF CRYSTAL IN GRAIN OR COLONY.
GRAIN TO GRAIN MISORIENTATION IS LESS THAN 15 DEGREES.
*FIG. 7*

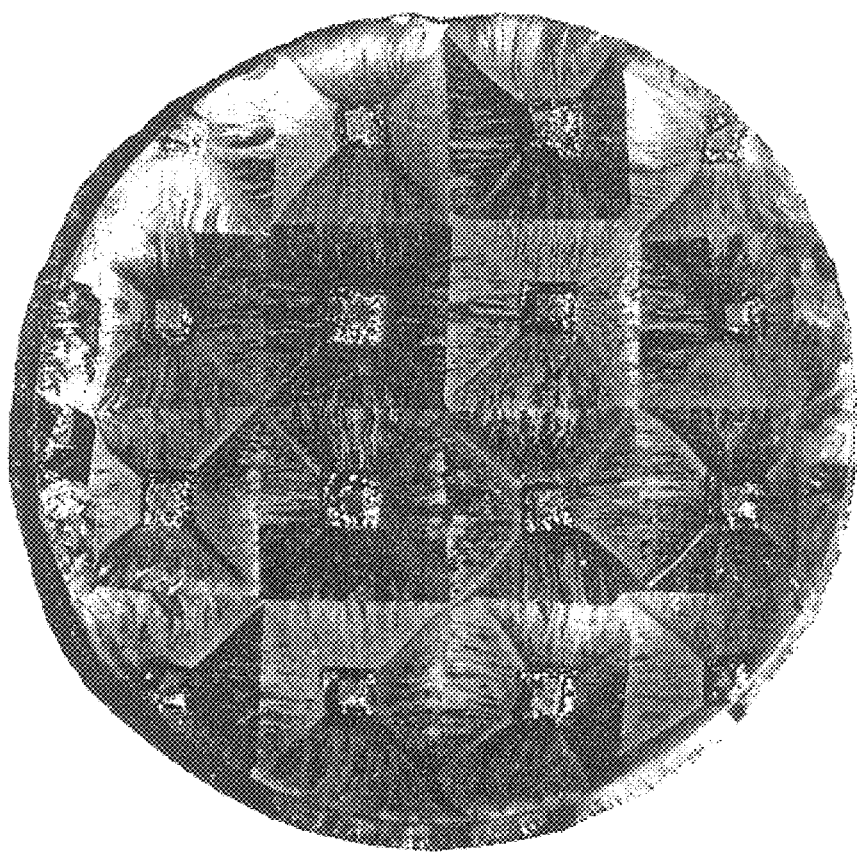
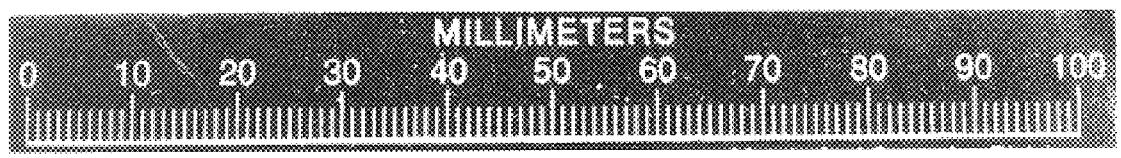
FIG. 8

METHOD FOR PREPARING PREFERENTIALLY ORIENTED, HIGH TEMPERATURE SUPERCONDUCTORS USING SOLUTION REAGENTS

CROSS-REFERENCE TO RELATED APPLICATIONS

This application is a continuation of U.S. patent application Ser. No. 08/931,631 filed on Sep. 16, 1997, now U.S. Pat. No. 6,256,521.

STATEMENT REGARDING FEDERALLY SPONSORED RESEARCH OR DEVELOPMENT

This invention was made with government support under contract DE-AC05-96OR22464, awarded by the United States Department of Energy to Lockheed Martin Energy Research Corporation, and the United States Government has certain rights in this invention.

FIELD OF THE INVENTION

The present invention relates to bulk superconductors and a novel seeding and growth process for preparing a bulk multi-domained superconducting material having strongly-linked low-angle domain boundaries.

BACKGROUND OF THE INVENTION

Since the discovery of high temperature oxide superconducting materials having critical temperatures that exceed the temperature of liquid nitrogen, there has been a concerted effort to utilize these materials for various applications. Although many applications are aimed at replacing conventional superconductors in wires and electronic devices, new applications using bulk materials also have been proposed. These applications include, for example, use in energy storage devices such as flywheels, use in current leads for superconducting magnets, and in magnetic bearings, bulk magnets, and magnetic resonance imaging machines (MRI).

For applications such as those noted in the proceeding paragraph, high temperature superconducting materials with large critical current density ($J_c$) are required. One such high temperature superconducting material is a composite oxide of RE, Ba and Cu, and in particular, $REBa_2Cu_3O_x$ (wherein RE representing at least one of the following rare earth elements: Y, La, Sm, Nd, Eu, Gd, Dy, Ho, Er, Tm, Yb, or Lu).

One of the main factors that hinders the practical application of bulk high temperature $REBa_2Cu_3O_x$ superconductors is the limited size in melt-processed material of the oriented domains, or regions which contain primarily small angle grain boundaries and consequentially have properties similar to those of single crystals. Additionally, the $J_c$ of $REBa_2Cu_3O_x$ has been restricted by the presence of high angle boundaries which constitute weak links through which the current density drops dramatically in the presence of a magnetic field. Critical current density also decreases strongly with the angle between transport current and the strongly superconducting a-b planes. Thus, for these materials to be utilized in large scale practical applications, the entire specimen should consist of an oriented domain with its associated quasi-single crystalline characteristics.

Conventional melt growth and texturing processes have been developed to attempt to eliminate grain boundaries and exclude weak links, thereby increasing critical current density, field trapping capacity, and levitation force of high temperature superconductors. These enhanced properties are only exhibited within a single oriented domain less than 10 mm in size. Unfortunately, because nucleation is not controlled in conventional melt growth and texturing processes, the bulk samples formed from those processes generally consist of multiple misoriented domains with high-angle domain boundaries which are also limited in size. Although the $J_c$ within an oriented domain is generally on the order of $10^5$ A/cm$^2$, it decreases to values in the range of $10^2$–$10^3$ A/cm$^2$ when the current is required to flow through high-angle domain boundaries. To date, limitations in seed size, growth rate, and temperature processing range of high temperature superconductors have limited the sizes of single domains which can be produced by specialized processes such as seeding in the presence of chemical and temperature gradients. However, these processes require long processing time and are not suitable for mass production of superconductors.

Directional solidification techniques also have been developed for producing relatively long (<100 mm) single domained samples when the cross-sectional area is limited. When the cross section exceeds approximately 3 mm×3 mm, however, lateral temperature gradient causes formation of a superconductor that is multi-domained and misaligned.

Seeding has been proposed as a way to control grain orientation in the $REBa_2Cu_3O_x$ superconducting system. Seeding by single-crystalline $SmBa_2Cu_3O_x$ and $NdBa_2Cu_3O_x$ has been successful in producing $YBa_2Cu_3O_x$ domains of 30 to 50 mm in size. However, at least four main problems remain to be overcome before $REBa_2Cu_3O_x$ can be used in practical applications to obtain larger materials; these are 1) the size of the oriented domain, 2) weak links within the domain, 3) limitations with respect to the types of RE that can be used, and 4) impractical manufacturing time and cost. These problems would all be alleviated, to some degree, if larger seeds were available.

In conventional melt processing by small seeds of a few millimeters (mm) in diameter, the size of the $REBa_2Cu_3O_x$ that can be grown is limited as a result of grain impingement between the seeded domain and the neighboring domains which result from undesirable nucleation centers. Additionally, the degree of crystal perfection decreases, whereas the variation in chemical composition increases, as the growth front moves farther away from the seed. In other words, as the domain size increases, superconducting properties degrade. This decreasing quality of large single-domained high temperature superconductors has been confirmed by x-ray rocking curve analyses where the c-axis alignment is found to be degraded as the domain size increases. (see R. L. Meng et al., *Physica C* 232 (1994) 337).

Limitations in sample type have also been problematic. For example, $YBa_2Cu_3O_x$ can be produced by $SmBa_2Cu_3O_x$ seeds because its decomposition temperature is higher than that of $YBa_2Cu_3O_x$, but $NdBa_2Cu_3O_x$ cannot be obtained in the same fashion. As a result, large single domained $NdBa_2Cu_3O_x$, which has been shown to have more desirable properties than $YBa_2Cu_3O_x$, cannot be obtained at this time.

In addition to the quality of the superconductors, the time and cost of manufacturing is also of concern. To obtain as large a domain as possible using small seeds, the cooling rate has to be extremely slow such that the manufacturing time of 20 mm size samples is typically well in excess of 100 hours. For samples on the order of 100 mm, the processing time would be measured in terms of weeks, if it were at all possible to fabricate samples of such dimensions.

To obtain large domains from small seeds, the growth front of the seeds must remain stable while proceeding for a large distance. High supercooling along the growth direction often leads to disorderly production of nuclei at the later stage of crystal growth resulting in multi-domained high temperature superconductors. To date, only when special modifications such as composition and/or sizable temperature gradients are employed can large single-domained $REBa_2Cu_3O_x$ be obtained. Although the domain size may be increased by these processes, the $J_c$ of such samples still is considerably smaller than that of small-domained specimens, indicating that weak links are still present in the apparent single-domained superconductors.

For further background information, please refer to the following publications:

1. K. Salama, V. Selvamanickam, L. Gao and K. Sun, *Appl. Phys. Lett.* 54 (1989) 2352.
2. P. J. McGinn, W. Chen, N. Zhu, M. Lanagan and U. Balachandran, *Appl. Phys. Lett.* 57 (1990) 1445.
3. V. Selvamanickam, C. Partsinevelos, A. V. McGuire and K. Salama, *Appl. Phys. Lett.* 60 (1992) 3313.
4. K. Sawano, M. Morita, M. Tanaka, T. Sasaki, K. Kimura and K. Miyarnota, *Jap. J. App. Phys.*, 30 (1991) L1157.
5. M. Hashimoto, M. Tanaka, M. Morita, K. Kimura, S. Takebayashi, H. Teshima, M. Sawamura and K. Miyamoto, in, in *Proc. 6th US-Japan workshop on High Tc Supercond.*, K. Salama, C. W. Chu and W. K. Chu, eds. (World Scientific, Singapore, 1994) p. 89.
6. D. F. Lee, C. S. Partsinevelos, R. G. Presswood, Jr. and K. Salama, *J. Appl. Phys.* 76 (1994) 603.
7. R. L. Meng, L. Gao, P. Gautier-Picard, D. Ramirez, Y. Y. Sun and C. W. Chu, *Physica C* 232 (1994) 337.
8. D. Dimos, P. Chaudhari and J. Mannhart, *Phys. Rev. B* 41 (1990) 403.
9. A. Goyal, D. P. Norton, J. D. Budai, M. Paranthaman, E. D. Specht, D. M. Kroeger, D. K. Christen, Q. He, B. Saffian, F. A. List, D. F. Lee, P. M. Martin, C. E. Klabunde, E. Hatfield and V. K. Sikka, *Appl. Phys. Lett* 69 (1996) 1795.
10. D. P. Norton, A. Goyal, J. D. Budai, D. K. Christen, D. M. Kroeger, E. D. Specht, Q. He, B. Saffian, M. Paranthaman, C. E. Klabunde, D. F. Lee, B. C. Sales and F. A. List, *Science* 274 (1996) 755.
11. Y. Iijima, N. Tanabe, O'Kohno and Y. Ikeno, *Appl. Phys. Lett.* 60 (1992) 769.
12. R. P. Reade, P. Berdahl, R. E. Russo and S. M. Garrison, *Appl. Phys. Lett* 61 (1992) 2231.
13. X. D. Wu, S. R. Foltyn, P. N. Arendt, W. R. Blumenthal, I. H. Campbell, J. D. Cotton, J. Y. Coulter, W. L. Hults, M. P. Maley, H. F. Safar and J. L. Smith, *Appl. Phys. Lett* 67 (1995) 2397.

Accordingly, a primary object of the present invention is to solve the above problems and to provide multi-domained bulk high temperature superconductor material having strongly-linked, low-angle domain boundaries and which resembles a quasi-single domained material and a process for making the same. Further and other objects of the present invention will become apparent from the description contained herein.

The terms "process", "method", and "technique" are used interchangeably herein.

The designation "(RE1)$Ba_2Cu_3O_x$" used herein refers to $REBa_2Cu_3O_x$ seed material in the form of single crystals, single-domained melt-textured pieces, and the designation "(RE2)$Ba_2Cu_3O_x$" refers to a final bulk superconductor precursor material to be grown as a product.

BRIEF SUMMARY OF THE INVENTION

We have developed a processing method that solves the aforementioned problems by producing multi-domained bulk (RE2)$Ba_2Cu_3O_x$ with low-angle domain boundaries. Since the domain boundary angles are engineered to be low and are relatively free of insulating secondary phases, these oriented domains are strongly-linked, and the bulk superconductor resembles a quasi-single domained material.

According to the method of this invention, multiple seeds, which can be small single crystals, single domained melt-textured (RE1)$Ba_2Cu_3O_x$ pieces, textured substrates comprised of grains with low misorientation angles, or thick film (RE1)$Ba_2Cu_3O_x$ deposited on such textured substrate, such seeds being tailored for various (RE2)$Ba_2Cu_3O_x$ compounds, are arranged on (RE2)$Ba_2Cu_3O_x$ superconductor precursor material in specific patterns and relative seed orientations. The superconductor precursor material may rest on a porous substrate before seeding so as to reduce the amount of liquid phase in the melt.

According to a method of this invention, seeded growth proceeds from individual seeds resulting in strongly-linked low-angle domain boundaries that contain minimal amount of insulating phases. Because seeds can be arranged in virtually any pattern, high quality (RE2)$Ba_2Cu_3O_x$ elements of virtually unlimited size and complex geometry can be fabricated for use in current lead components in conventional superconducting magnets, magnetic bearings, for use in flywheel energy storage devices, as well as other applications. Additionally, the methods of the present invention will drastically reduce processing times and cost per sample and can readily be used for large scale production.

In one aspect, the present invention constitutes a novel seeding and growth process for preparing multi-domained bulk high temperature superconductors having strongly linked, low angle domain boundaries comprising the steps of:

preparing bulk (RE2)$Ba_2Cu_{3x}$superconductor precursor material;

fabricating seed material of an appropriate size for the final bulk (RE2)$Ba_2Cu_3O_x$ material to be produced;

forming an assembly comprised of said seed material and said superconductor precursor material by placing said seed material in intimate contact with said superconductor precursor material in an arrangement whereby the relative misorientation between individual seed crystals is less than 15°, preferably less than 5°, and whereby the subsequent growth fronts of adjacent domains will impinge along the direction normal to the (100) or (010) planes, i.e., the [100] or [010] central axes of neighboring seeds shall be as co-linear as possible such that the resultant domain boundaries are parallel to the (100) or (010) planes;

heating the assembly to a temperature higher than the decomposition temperature of the bulk superconductor precursor material but lower than the decomposition temperature of the seed/s material for a sufficient time to decompose the precursor material;

gradually cooling the assembly to a temperature at which the bulk precursor material has solidified completely;

further cooling the assembly to room temperature; and treating said assembly in an oxidizing atmosphere to add oxygen to the assembly and to obtain a bulk superconductor of (RE2)$Ba_2Cu_3O_x$.

In another aspect, the present invention constitutes a process for producing a bulk superconductor with a porous substrate for liquid phase removal comprising the steps of:

preparing bulk (RE2)$_2Ba_2Cu_3O_x$ superconductor precursor material;

placing the bulk (RE2)$Ba_2Cu_3O_x$ superconductor precursor on a nonreactive, nonnucleating porous substrate comprised of (RE2)$_2Ba_2CuO_5$ material;

fabricating seed material of an appropriate size for the final bulk (RE2)$Ba_2Cu_3O_x$ material to be produced;

forming an assembly comprised of said seed material and said superconductor precursor material by placing said seed material in intimate contact with said superconductor precursor material in an arrangement whereby the relative misorientation between individual seed crystals is less than 15°, preferably less than 5°, and whereby the subsequent growth fronts of adjacent domains will impinge along the direction normal to the (100) or (010) planes, i.e., the [100] or [010] central axes of neighboring seeds shall be as co-linear as possible such that the resultant domain boundaries are parallel to the (100) or (010) planes;

heating the assembly to a temperature higher than the decomposition temperature of the bulk superconductor precursor material but lower than the decomposition temperature of the seed/s material for a sufficient time to decompose the precursor material;

gradually cooling the assembly to a temperature at which the bulk precursor material has solidified completely;

further cooling the assembly to room temperature;

treating said assembly in an oxidizing atmosphere to add oxygen to the assembly; and to obtain a bulk superconductor of (RE2)$Ba_2Cu_3O_x$.

In yet another aspect, there is provided a novel sequential seeding and growth process for preparing multi-domained bulk high temperature superconductors having strongly linked, low angle domain boundaries.

In yet another aspect, there is provided a multi-domained, bulk oxide superconductor in the form of a complex oxide of RE, Ba and Cu, where RE represents at least one element selected from the group consisting of Y, Sm, Nd, Eu, Gd, Dy, Ho, Er, Tm, Yb, or Lu, said superconductor having low-angle domain boundaries such that said superconductor functions as a quasi-single domained material.

BRIEF DESCRIPTION OF THE SEVERAL VIEWS OF THE DRAWINGS

For a better understanding of the present invention, together with other and further objects, advantages and capabilities thereof, reference is made to the following disclosure and appended claims in connection with the drawings described below:

FIGS. 5a–d illustrate side views of a various seed arrangement used for small single crystal seeds or small single-domained melt-textured (RE1)$Ba_2Cu_3O_x$ seeds used to form the bulk superconductor material of the present invention with or without the utilization of porous substrate support;

FIGS. 6a–b illustrates a side view of a seed arrangement used to grow thick layered superconductor material of the present invention;

FIG. 7 is a schematic illustration of a textured substrate of the present invention as well as the appearance of (RE1)$Ba_2Cu_3O_x$ deposited on such a textured substrate; and FIG. 8 is a photograph showing a $YBa_2Cu_3O_x$ bearing element with $SmBa_2Cu_3O_x$ seeds in accordance with the method described in Example I;

DETAILED DESCRIPTION OF THE INVENTION

Figure 1:
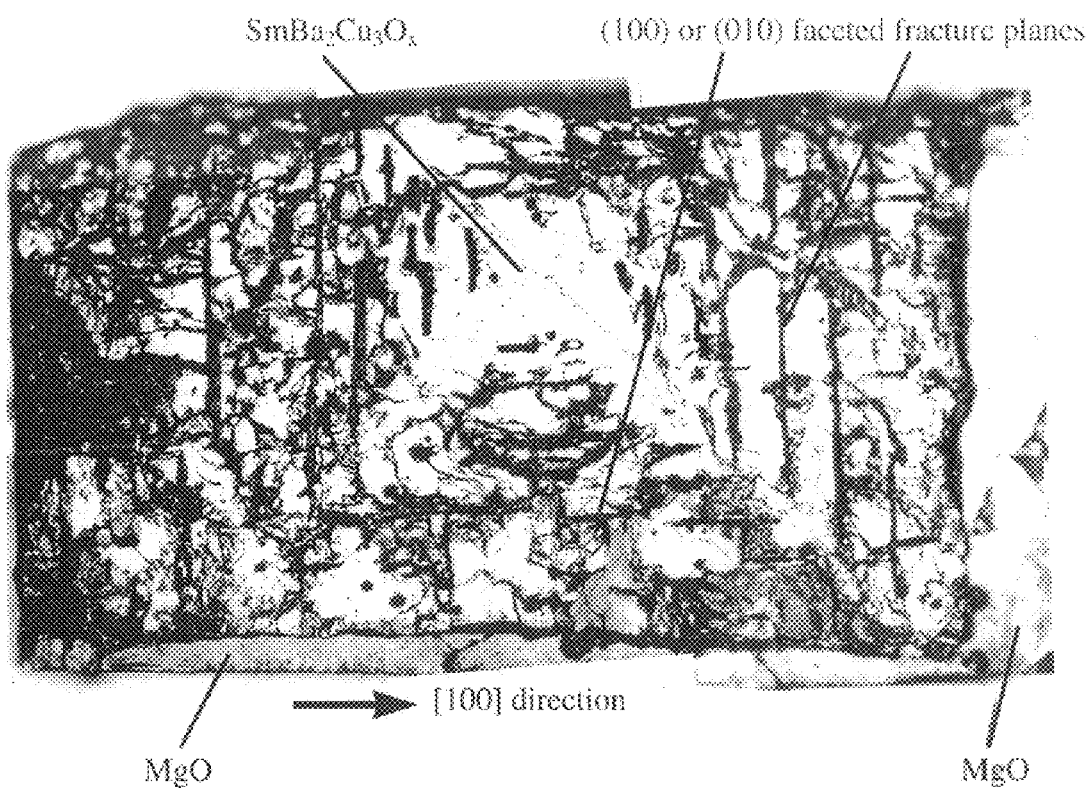
FIG. 1 is a photograph showing a MgO seed crystal cleaved from a textured $SmBa_2Cu_3O_x$ material. A small amount of textured $SmBa_2Cu_3O_x$ material is still attached to the MgO seed crystal and shows the faceted (100) and (010) fracture planes which are parallel to the <100> axes of the MgO seed crystal.

The preferred embodiment of a method for producing multi-domained bulk (RE2)$Ba_2Cu_3O_x$ with strongly-linked, low-angle domain boundaries is described below.

Formation of Bulk (RE2)$Ba_2Cu_3O_x$ Superconductor Precursor Material

1. Simple Shapes/geometries

To form (RE2)$Ba_2Cu_3O_x$ superconductor precursor material for use in applications of simple shapes, such as typical round disk-shaped or rectangular bar applications, conventional techniques such as pressing and extrusion of (RE2)$Ba_2Cu_3O_x$, with or without the addition of nonreactive, nonsuperconducting particles such as Pt, (RE2)$_2BaCuO_5$ can be employed. The superconductor precursor material then may be placed in contact with a porous substrate (described below), which substrate may be formed into appropriate shaped geometry to coincide with the shape of the superconductor precursor material. Note, however, that the porous substrate need not be used prior to seeding in all applications.

2. Complex Shapes/geometries

For applications requiring complex geometry, such as shapes having openings or cavities, and where very large-dimension samples are required, such bulk precursor material is formed by powder techniques such as plasma spraying. In this method of forming bulk precursor material, powder of a porous, nonreactive, nonsuperconducting substrate material such as $(RE2)_2BaCuO_5$ is sprayed or deposited onto metallic or ceramic substrate of desired geometry/shape. After the substrate has been formed, an appropriate amount of $(RE2)Ba_2Cu_3O_x$ powder with or without additions of Pt or $(RE2)_2BaCuO_5$ is then deposited onto the $(RE2)_2BaCuO_5$ layer on the substrate. The bulk precursor material formed by this method can be utilized as is in subsequent texturing treatment, or the sample can first be densified by sintering, isostatic or quasi-isostatic pressing, and partial melting.

Formation and Use of Porous Substrate to Reduce the Amount of Liquid Phase in the Superconductor A porous substrate is a compact of nonreactive particles, such as $(RE2)_2BaCuO_5$ particles, with random crystal orientations. When used with small, simple shaped bulk $(RE2)Ba_2Cu3O_x$ precursor material, it is generally formed by pressing or extrusion, as discussed above. When used with large, complex shaped bulk $(RE2)Ba_2Cu_3O_x$ precursor material, it is generally formed by powder techniques such as plasma spraying, also discussed above.

As illustrated in FIGS. 5b and d, a porous substrate 22 may be used as a "holder" or "platform" for bulk $(RE2)Ba_2Cu_3O_x$ 16; the bulk $(RE2)Ba_2Cu_3O_x$ superconductor precursor material 16 rests directly on the porous substrate 22 (when a porous substrate is used). Because the porous substrate and the superconducting precursor material are composed of the same elements, the porous substrate will not react adversely with the superconductor precursor material during melting. Because the porous substrate does not cause nucleation in the precursor material, the solidified superconductor will not assume the random crystal orientation of the porous substrate after melt-texturing (unlike seed materials, which dictate the crystal orientation of melt-textured superconductor).

One of the main reasons for using a porous substrate is to reduce the amount of liquid phase at the superconductor domain boundaries. In addition, once the superconducting recursor has been melted and solidified, it will bond to the porous substrate, which provides mechanical support for the weak superconductor material.

A porous substrate generally is composed of the same RE2(rare earth) element as the bulk $(RE2)Ba_2Cu_3O_x$ precursor to be formed as the final product. This is because the liquid phase that is absorbed by the $(RE2)_2BaCuO_5$ porous substrate will convert part of the $(RE2)_2BaCuO_5$ porous substrate into superconducting $(RE2)Ba_2Cu_3O_x$, thus leading to an increased volume of superconductor as well as better bonding between the bulk superconductor and substrate for enhancement in mechanical support.

To prepare a porous substrate, an appropriate amount of nonreactive material that does not act as nucleation center in the $(RE2)Ba_2Cu_3O_x$ system, such as $(RE2)_2BaCuO_5$, is formed into a porous substrate. The forming process can either be separated or can be incorporated into the forming procedure of the bulk $(RE2)Ba_2Cu_3O_x$ superconductor precursor material. Because of variations in the growth rate of doped or undoped $(RE2)Ba_2Cu_3O_x$ (i.e. $(RE2)Ba_2Cu_3O_x$ in which a small amount of one atom of RE2 has been added to replace another) and available process temperature range of various $(RE2)Ba_2Cu_3O_x$ compounds, the amounts of porous substrate will be tailored to individual situations with the ultimate requirement that the amount is sufficient to reduce the presence of residual liquid phase at the domain boundaries. Thus, for example, if the superconducting compound to be formed is $YBa_2Cu_3O_x$, an amount of $Y_2BaCuO_5$ equal to 30–50 weight % of that of $YBa_2Cu_3O_x$ should be used in the forming of the textured substrate.

Seed Fabrication and Arrangement

In the present invention, various seed materials can be utilized depending on the type and size of the $(RE2)Ba_2Cu_3O_x$ to be prepared. With regard to the type of $(RE2)Ba_2Cu_3O_x$ to be processed, the decomposition temperature of the seed material should be higher than that of the $(RE2)Ba_2Cu_3O_x$ under consideration.

In this invention, seeds can be either small single crystals, single domained melt-textured $(RE1)Ba_2Cu_3O_x$ pieces (as described below), textured substrate comprised of grains having low misorientation angles, or thick film $(RE1)Ba_2Cu_3O_x$ deposited on such a textured substrate. For example, $SmBa_2Cu_3O_x$, or $NdBa_2CU_3O_x$, seeds (either in single crystal form, single-domained melt-textured form, or grown on textured substrate) can be used to grow other $(RE2)Ba_2Cu_3O_x$ (where RE2is neither Sm nor Nd). Similarly, single crystal (001) MgO seeds can be used to grow $SmBa_2Cu_3O_x$ or $NdBa_2Cu_3O_x$.

For example, to obtain oriented $SmBa_2Cu_3O_x$ by seeding, rectangular MgO single crystals with faces parallel to the (100) planes are cut from a bulk MgO single crystal. Bar shaped bulk $SmBa_2Cu_3O_x$ precursor material is prepared by pressing, and MgO single crystals are arranged on top of the precursor material with less than 5° misorientation between the [100] axes. In addition, the [100] central axes of adjacent seeds are co-linear. The precursor and seed assembly is introduced into a box furnace and heated to 1100° C. After holding at this temperature for 30 min., the temperature is lowered to 1070° C. at a rate of 120° C./h, and then reduced to 1000° C. at a rate of 0.5–2° C./h. Once the temperature has reached 1000° C., the sample is cooled to room temperature at a rate of 60° C./h.

FIG. 1 shows the appearance of a MgO seed that has been cleaved from the bulk $SmBa_2Cu_3O_x$ superconductor following seeding. Layers of textured $SmBa_2Cu_3O_x$ superconductor remain bonded to the MgO crystal during extraction. The MgO crystal and the fracture surface of $SmBa_2Cu_3O_x$ are identified in the figure. It can be seen from this figure that the faceted fracture steps of the $SmBa_2Cu_3O_x$, which lie along the (100) and (010) planes, are parallel to the [100] direction of the MgO crystal demonstrating that seeded growth of $SmBa_2Cu_3O_x$ has been successful.

With regard to the size of the bulk superconductor material to be processed, small single crystals or single-domained melt-textured $(RE1)Ba_2Cu_3O_x$ may be used to produce relatively small bulk $(RE2)Ba_2Cu_3O_x$ superconductors (less than or equal to a few cm in size). If the bulk superconductor material to be formed is of a dimension that requires a large number of seeds, large single domained $(RE1)Ba_2Cu_3O_x$ grown by seeding, thick film $(RE1)Ba_2Cu_3O_x$ deposited on textured substrate or textured substrate material itself should be used as the seed material.

To fabricate $SmBa_2Cu_3Ox$ or $NdBa_2Cu_3Ox$ seeds, bulk samples of these compounds are formed and are melt-textured by conventional methods. For example, bulk $SmBa_2Cu_3Ox$ is partially melted at 1100° C. The temperature is then lowered to 1070° C. where slow cooling at a rate of 0.5–2° C./h commenced until the sample solidifies. This process forms multi-domained seed material.

Single domains may be cut from the multi-domained material, and the a-b planes, i.e. (001) planes, are exposed by cleaving. Seeds of appropriate dimensions are cut and polished from these domains with the surfaces parallel to the a-b planes and the edges parallel to the [100] and [010] directions.

Large (RE1)$Ba_2Cu_3O_x$ seeds to be used for processing of bulk (RE2)$Ba_2Cu_3O_x$ of lower decomposition temperatures are prepared by conventional seeding with $SmBa_2Cu_3O_x$ or $NdBa_2Cu_3O_x$. A cleaved surface (a-b planes) of $SmBa_2Cu_3O_x$ or $NdBa_2Cu_3O_x$ is placed in intimate contact with bulk (RE1)$Ba_2Cu_3O_x$ to form an assembly comprised of the superconductor precursor material together with the seed. The entire assembly is then heated to a temperature higher than the decomposition temperature of (RE1)$Ba_2Cu_3O_x$ but lower than that of $SmBa_2Cu_3O_x$ or $NdBa_2Cu_3O_x$ for partial melting. After (RE1)$Ba_2Cu_3O_x$ has decomposed, the assembly is cooled at 0.5 to 2° C./h until the material has solidified. Large (RE1)$Ba_2Cu_3O_x$ seeds of appropriate shapes are cut from the single domain with the surfaces parallel to the a-b plane and the edges parallel to the [100] and [010] directions. Large single domained (RE1)$Ba_2Cu_3O_x$ pieces of material grown by seeding, and textured substrate materials, with or without thick film (RE1)$Ba_2Cu_3O_x$ deposits (as described below) can then be used to grow (RE2)$Ba_2Cu_3O_x$ of lower decomposition temperatures (e.g., where RE1=Y and RE2=Ho or Yb).

Large textured substrates to be used as seed/s for growing large, bulk (RE2)$Ba_2Cu_3O_x$ superconductor may be fabricated by processes such as the Rolling-Induced Biaxially Textures Substrates ("RABiTS") (see A. Goyal et al., *Appl. Phys. Lett.*, 69 (1996) 1795; D. P. Norton et al., *Science*, 274 (1996) 755) and Ion Beam Assisted Deposition ("IBAD") methods (see Y. Iijima, et al., *Appl. Phys. Lett.* 60 (1992) 769; R. P. Reade, et al. *Appl. Phys. Lett.* 61 (1992) 2231; and X. S. Wu et al., *Appl. Phys. Lett.* 67 (1995) 2397).

RABiTS textured substrates are produced by deforming a metal or metallic alloy by mechanical methods, such as rolling or pressing, followed by recrystallization such that the metal or metallic alloy is highly textured with grain-to-grain misorientation of less than 15°. Selected ceramic or metallic buffer layer/s such as Pd, Pt, Ag, $A_mO_n$, A-stabilized zirconia, $A_iTi_jO_k$ and $A_xAl_yO_z$ (where A=alkaline earth and rare earth) are deposited onto the metallic substrate by physical vapor deposition, chemical vapor deposition, or solution techniques, such that the layer being deposited retains the crystal orientation relationship of the metallic substrate and the lattice mismatch of the top most layer differs by no more than 10% from the bulk (RE2)$Ba_2Cu_3O_x$ material.

The term "solution techniques," as used above, refers to deposition methods which involve solutions such as sol-gel or metal-organic that contain the appropriate amount and type of cations. The solution is deposited onto the substrate by methods such as spin coating and dip coating, and forms a continuous film on the substrate. After appropriate treatments to dry, pyrolyze and react the solution, a film of desired composition and crystallographic orientation is left on the original substrate.

IBAD textured substrates are produced by depositing a layer of ceramic material onto a metallic substrate with an assisting ion beam positioned at an appropriate angle such that the undesired crystal orientations are eliminated. A cube textured ceramic layer with small grain to grain misorientation results. Selected metallic or ceramic buffer layer/s such as Pd, Pt, Ag, $A_mO_n$, A-stabilized zirconia, $A_iTi_jO_k$ and $A_xAl_yO_z$ (where A=alkaline earth and rare earth) may be deposited onto the ceramic layer by physical vapor deposition, chemical vapor deposition, or solution techniques such that the layer being deposited retains the crystal orientation relationship of the IBAD deposited ceramic layer and the lattice mismatch of the top most layer differs by no more than 10% from the bulk (RE2)$Ba_2Cu_3O_x$ material.

FIG. 7 illustrates a schematic over-head view of a textured substrate or (RE1)$Ba_2Cu_3O_x$ deposited on a textured substrate. The illustrated grains 18 are representative of grains of the metallic substrate or metallic buffer layer used in the RABiTS or IBAD substrate preparations, or of a colony of deposited (RE1)$Ba_2Cu_3O_x$ on a buffer layer. Each arrow 20 represents the [100] axis of a crystal in each grain or colony 18.

Thick film (RE1)$Ba_2Cu_3O_x$ can be deposited onto textured substrates by various methods. These include physical vapor deposition techniques such as pulsed laser deposition (PLD), e-beam evaporation and sputtering, chemical vapor deposition techniques such as metal organic chemical vapor deposition (MOCVD) and solution techniques such as sol-gel and metal-organic deposition. For example, (RE1)$Ba_2Cu_3O_x$ thick film can be deposited onto a textured substrate using solutions such as trifluoroacetate (TFA). In this example, a TFA solution containing the appropriate amount and type of cations is spin coated onto the textured substrate at 6000 rpm at room temperature. After spin coating, the coated substrate is heated to 450° C. in a one atmosphere humidified oxygen environment. Following the one atmosphere oxygen pre-treatment, the coated substrate is heat treated at 825° C.–860° C. in 1000 ppm humidified oxygen for 1 h, at which time an epitaxial (RE1)$Ba_2Cu_3O_x$ film is formed.

Figure 12:
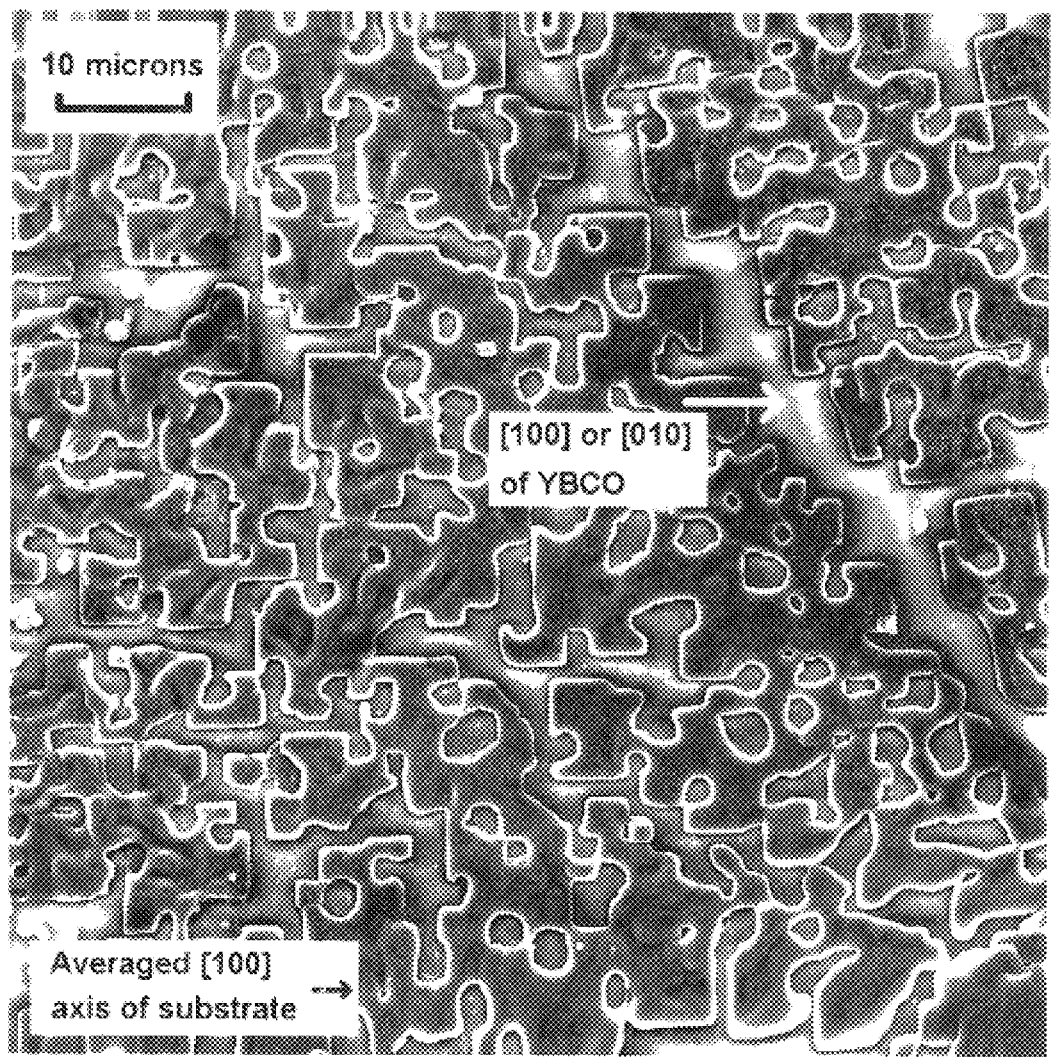
FIG. 12 is a scanning electron micrograph of a $YBa_2Cu_3O_x$ film deposited on YSZ/$CeO_2$/Ni RABiTS textured substrate using TFA solution. The [100] or [010] axes of the $YBa_2Cu_3O_x$ grains are approximately identical to the averaged [100] axis of the substrate.
Figure 13:
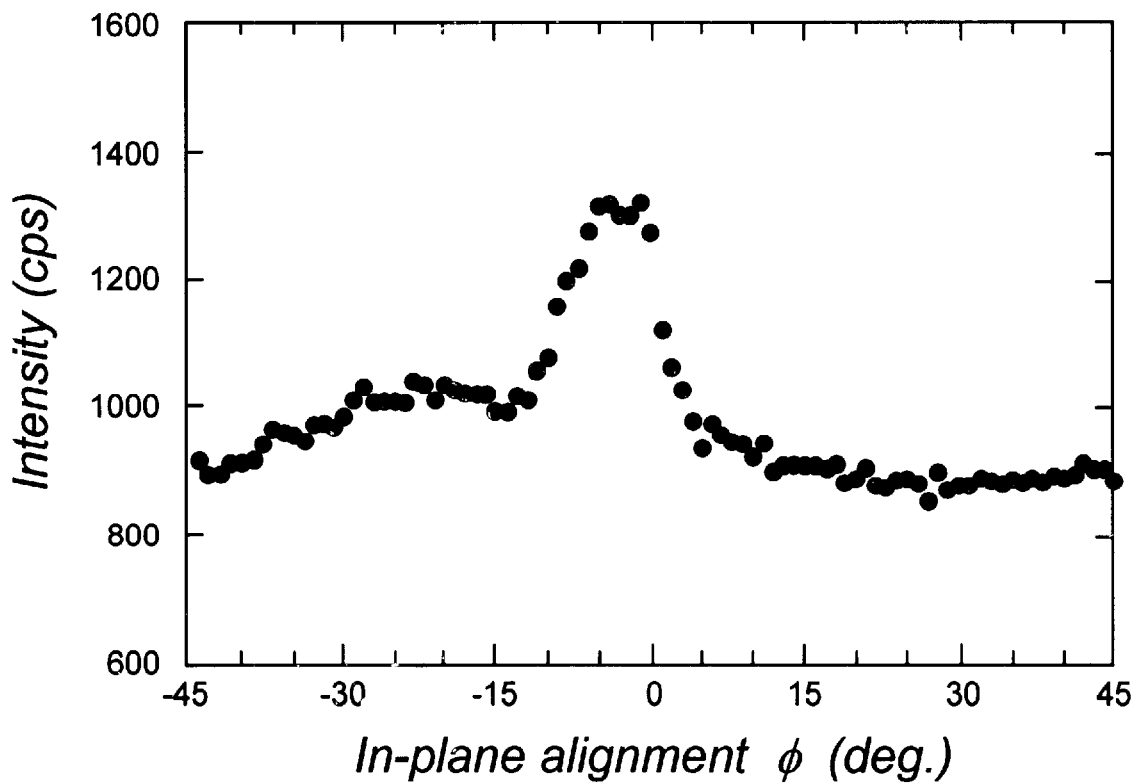
FIG. 13 is an x-ray phi-scan of a $YBa_2Cu_3O_x$ film deposited on YSZ/$CeO_2$/Ni RABiTS textured substrate using TFA solution. A substantial amount of the $YBa_2Cu_3O_x$ grain display [100] or [010] misorientation angles of 13° full-width-at-half-maximum.

After the (RE1)$Ba_2Cu_3O_x$ formation, the substrate is cooled to room temperature. A scanning electron micrograph of a $YBa_2Cu_3O_x$ film processed by the above method on a RABiTS substrate comprised of a 7000 Å thick Y-stabilized zirconia buffer on a 400 Å thick $CeO_2$ buffer on Ni is shown in FIG. 12. It can be seen from this FIG. 12 that the $YBa_2Cu_3O_x$ film is formed epitaxially on the RABiTS substrate, with the [100] or [010] axes of $YBa_2Cu_3O_x$ grains approximately identical to the averaged [100] axis of the RABiTS substrate. In addition, X-ray phi-scan FIG. 13 of a similarly processed film shows that a substantial amount of the $YBa_2Cu_3O_x$ grains are oriented with a [100] or [010] misorientation angle of 13° full-width-at-half-maximum.

Some of the considerations relevant to determining the appropriate amount and type of seeds to use for a particular application are as follows. The number of seeds to be used depends on the size of the seed material. Where larger seeds are used, a smaller number of seeds is needed to cover the bulk superconducting precursor material. In addition, the number of seeds to be used is determined by the separation distance between the adjacent edges of neighboring seeds, which should be less than 20 mm and more than 1 mm.

The type of seed depends on the bulk (RE2)$Ba_2Cu_3O_x$ superconducting precursor to be melt-textured. For example, $A_mO_n$, A-stabilized zirconia, $A_iTi_jO_k$ and $A_xAl_yO_z$ (A=alkaline earth and rare earth) buffered textured substrates or single crystals should be used as seeds to grow bulk $SmBa_2Cu_3O_x$ and bulk $NdBa_2Cu_3O_x$. Whereas $SmBa_2Cu_3O_x$ or $NdBa_2Cu_3O_x$ single crystals, single-domained melt-textured pieces, or thick film on textured substrates should be used to grow bulk $(RE2)Ba_2Cu_3O_x$ superconductor (where RE2 is neither Sm nor Nd).

Once the appropriate number and type of seeds for the desired application are determined, the seeds are brought into intimate contact with the superconductor precursor material by at least one of the following methods: (1) seeds are embedded into the superconductor precursor material during formation of the superconductor precursor material; (2) seeds are placed on the superconductor precursor material before melt processing; or (3) seeds are placed on the superconductor precursor material after melting, but before solidification is initiated. The aforementioned methods are discussed in more detail in Example II below.

Figure 2A:
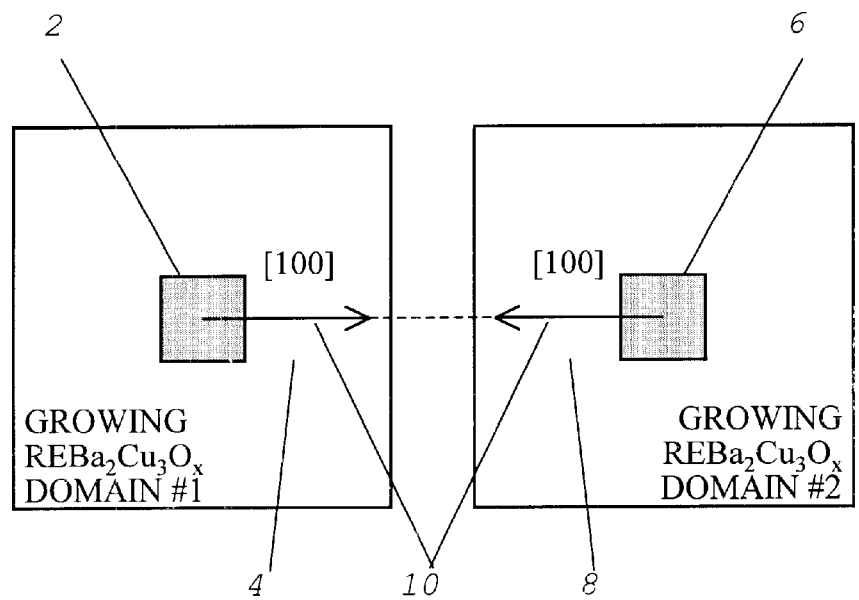
FIG. 2a illustrates a top view of a correct arrangement of a first and second seed on first and second growing $REBa_2Cu_3O_x$ domains in accordance with the present invention to provide for domain impingement along the normal direction to the (100) or (010) planes.

Seeds are placed such that the relative misorientation between the [100] or [010] axes of the seed crystals is less than 15°, and preferably less than 5°, and in an appropriate arrangement such that the subsequent (100) or (010) growth fronts of adjacent domains impinge onto one another along the direction normal to these growth fronts, i.e. the [100] or [010] central axes of adjacent seeds shall be as co-linear as possible such that the resultant domain boundaries are parallel to the (100) or (010) planes. FIG. 2a illustrates a correct arrangement of a first seed 2 on a first growing domain 4 and of a second seed 6 on a second growing domain 8 such that the [100] or [010] central axes 9 of neighboring seeds may be as co-linear as possible thus resulting in domain boundaries that are parallel to (100) or (010) planes. By contrast, if the central axes 9 deviate significantly from this co-linear arrangement, cracks may develop at the domain boundary even if the misorientation angle between two domains is low.

Figure 2B:
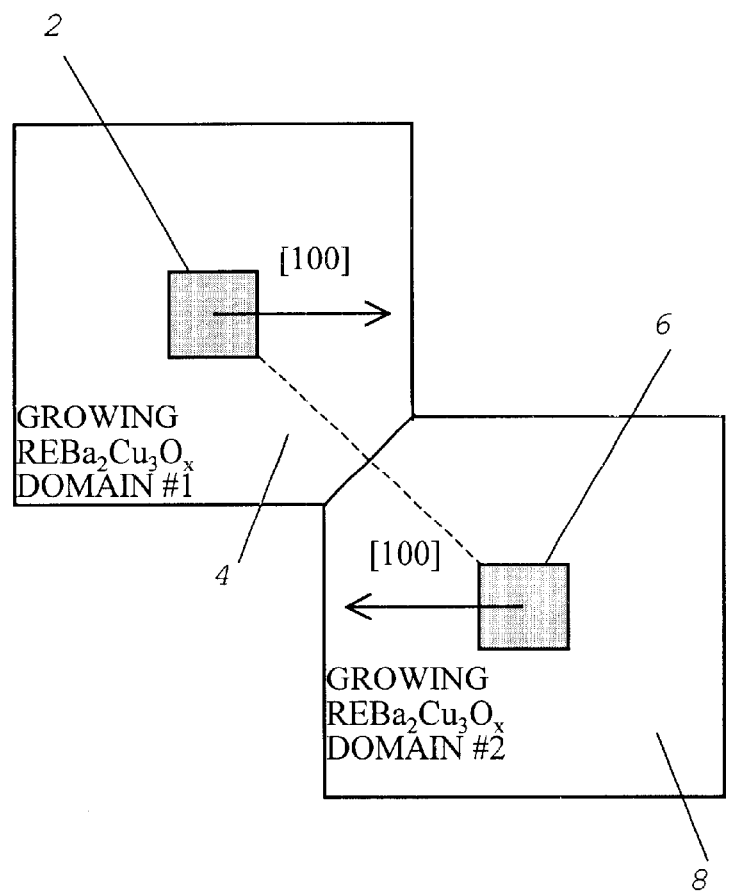
FIG. 2b illustrates a top view of an incorrect arrangement of a first and second seed on first and second growing $REBa_2Cu_3O_x$ domains.

In seeded growth of $(RE2)Ba_2Cu_3O_x$, the superconductor typically grows with faceted edges, i.e., growth fronts parallel to the {100} planes (where {100} represents the (100), (010) and (001) family of planes) and along the <100> directions (where <100> stands for [100], [010] and [001] family of directions). Consequently, the growing domain 4, i.e., the collection of growth fronts, originating from a nucleation center, will resemble a square when viewed along the [001] direction (overhead view). As neighboring domains 4 and 8 approach one another, the least amount of stress as well as crystal defects is generated if these {100} planes approach each other plan-wise resulting in domain boundaries that are parallel to the (100) or (010) planes, as shown in FIG. 2a. Thus, the [100] or [010] central axes of neighboring grains should be as co-linear as possible. If, on the other hand, the central axes are not co-linear, as illustrated in FIG. 2b, the resulting boundary will not be planar microscopically and will contain (100) and (010) faceted step which will result in high stresses and high defect density, and frequently leads to cracks. In addition, misorientation between the [100] or [010] axes of neighbor seeds should be less than 15°, preferably less than 5°, in order for the domain boundaries to be strongly linked.

Figure 3A:
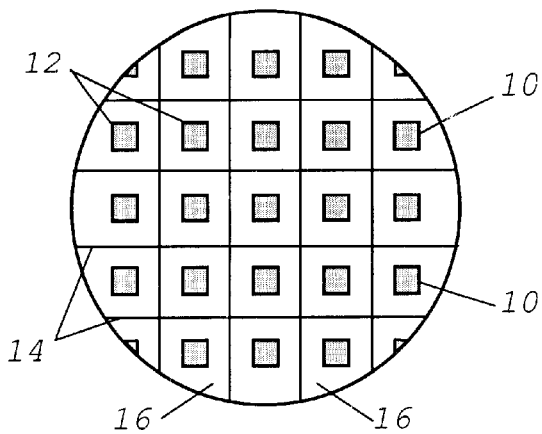
FIGS. 3a–d illustrate a top view of various seed arrangements used for small single crystal seeds or small single-domained melt-textured (RE1)$Ba_2Cu_3O_x$ seeds used to form the bulk superconductor material of the present invention.
Figure 3B:
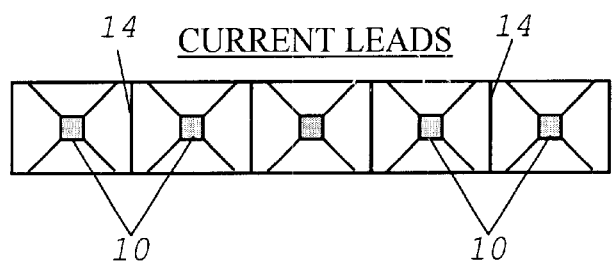
Figure 3C:
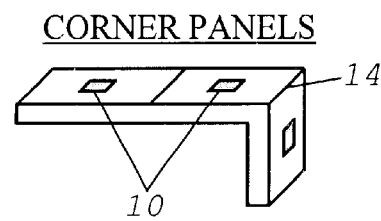
Figure 3D:
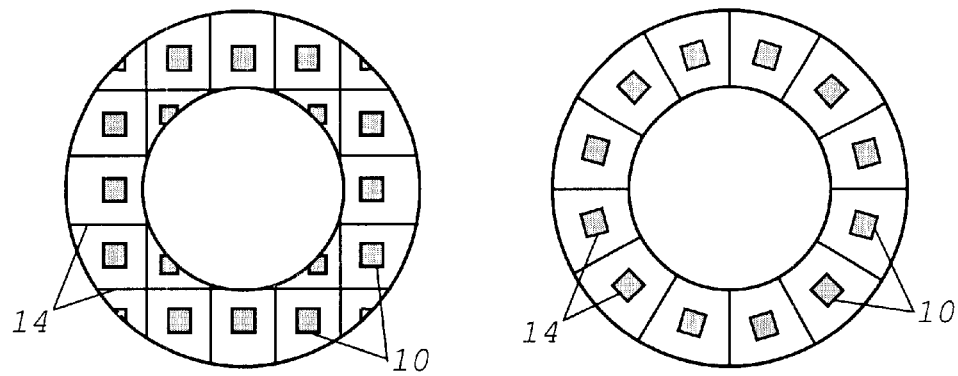

FIGS. 3a–d illustrate overhead views of appropriate placement of small single crystals or single-domained melt-textured $(RE1)Ba_2Cu_3O_x$ seeds used in processing of various shapes/geometries of superconductor precursor materials including, for example flywheel bearings (FIG. 3a), current leads (FIG. 3b), corner panels (FIG. 3c) and ring magnets (FIG. 3d). As illustrated in the embodiments set forth in FIGS. 3a, 3b, 3c, and 3d seeds 10 are formed into a small square shape and are placed such that seed growth at each seed will proceed such that the growth fronts from each adjacent square domain impinge upon each other plan-wise (i.e. from flat sides of the squares) resulting in domain boundaries 14 parallel to the (100) or (010) planes.

The corners 12 of adjacent seeds should not touch each other. Low angle domain boundaries 14 are formed between the seed crystals as they grow.

FIG. 3a illustrates an appropriate arrangement of seeds for producing a flywheel bearing wherein substantially square-shaped seeds are placed along the surface of bulk precursor material 16 formed in a substantially circular shape. $REBa_2Cu_3O_x$ domains nucleated from each seed 10 will grow toward each adjacent domain along the [100] or [010] direction such that the growth front of each domain impinges upon the growth front of each adjacent domain forming boundaries that are parallel to the (100) or (010) planes.

Figures 4A, 4B:
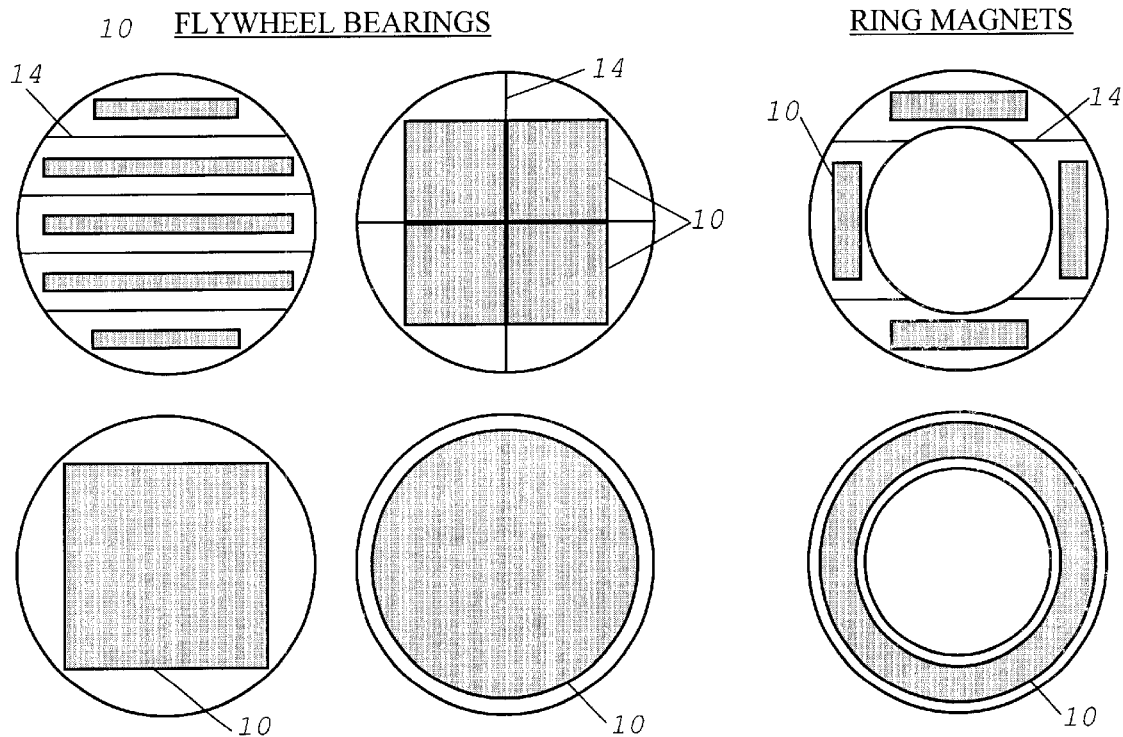
FIGS. 4a–d illustrate a top view of various seed arrangements used for textured substrates or thick film (RE1)$Ba_2Cu_3O_x$ on textured substrate seeds of the present invention.
Figures 4C, 4D:
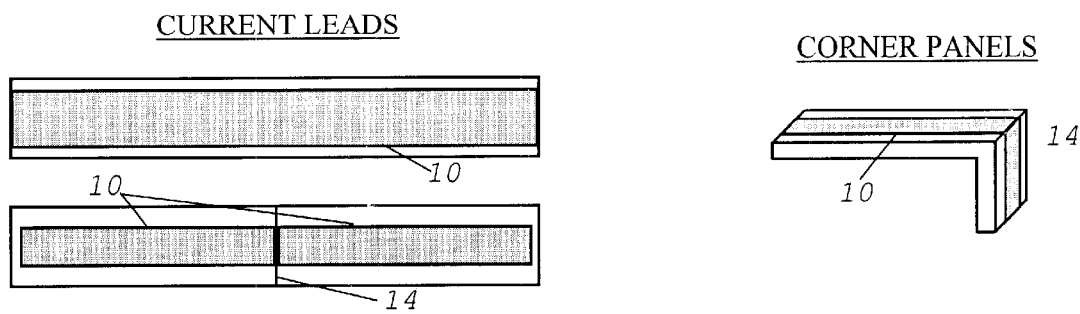

FIGS. 4a–d illustrate various applications of large seeds 10 comprising textured substrates alone or thick films of $(RE1)Ba_2Cu_3O_x$ deposited on textured substrates prepared by the RABiTS or IBAD methods described herein. FIG. 4a illustrates several arrangements of textured substrate or thick films as seeds 10 placed on fly wheel bearings. Domain boundaries 14 are also illustrated. FIG. 4b illustrates two variants of appropriate applications/arrangements of textured substrates or thick films as seeds 10 to produce superconducting ring magnets. FIG. 4c illustrates appropriate seed 10 arrangements for current leads to form low-angle domain boundaries 14, and FIG. 4d illustrates an appropriate seed 10 arrangement for corner panels to form low-angle domain boundaries 14.

FIGS. 5a–f illustrate side views of various seed arrangements. FIG. 5a shows a side view of an arrangement of small single crystal or melt textured $(RE1)Ba_2Cu_3O_x$ seeds 10 placed on bulk $(RE2)Ba_2Cu_3O_x$ material 16 to be seeded. The bulk material 16, which will be textured during seeding, contains low-angle domain boundaries and will form the final product. FIG. 5b shows a side view of an arrangement of small single crystal or melt textured $(RE1)Ba_2Cu_3O_x$ seeds placed on bulk $(RE2)Ba_2Cu_3O_x$ material 16, where the bulk material 16 rests on a porous substrate 22. Similarly, FIG. 5c illustrates a side view of one or more large melt-textured $(RE1)Ba_2Cu_3O_x$ seeds, textured substrate, or thick film $(RE1)Ba_2Cu_3O_x$ on textured substrate as seed material 10 placed on bulk $(RE2)Ba_2Cu_3O_x$ superconductor precursor material 16. FIG. 5d illustrates a side view of one or more large melt-textured $(RE1)Ba_2Cu_3O_x$ seeds, textured substrate, or thick film $(RE1)Ba_2Cu_3O_x$ on textured substrate as seed material 10 placed on bulk $(RE2)Ba_2Cu_3O_x$ superconductor precursor material 16. In FIG. 5d, the bulk $(RE2)Ba_2Cu_3O_x$ material 16 rests on a porous substrate 22.

A side view of a thick, layered, seeded high temperature superconductor including small single seed crystals or large melt-textured single domained crystals is illustrated in FIG. 6a. FIG. 6b illustrates a side view of a thick, layered superconductor including textured substrates or thick-film as seeds 10.

In another aspect, the present invention also includes a method for using sequential seeding to obtain large seeds with predetermined crystal orientations. The use of sequential seeding leads to a net reduction time in producing bulk superconductor material as it decreases the effort required to identify crystal orientation of seeds and the number of seeds needed.

In this aspect, the invention constitutes a process comprising the steps of first preparing bulk $(RE1)Ba_2Cu_3O_x$ superconductor precursor material through a similar process as described above for $(RE2)Ba_2Cu_3O_x$ superconductor precursor material. Seed material is then fabricated for the bulk $(RE1)Ba_2Cu_3O_x$ material to be produced. An assembly of the seed material and the superconductor precursor material is made by placing the seed material in intimate contact with the (RE1)$Ba_2Cu_3O_x$ superconductor precursor material. The assembly is heated to temperature higher than the decomposition temperature of the bulk (RE1)$Ba_2Cu_3O_x$ superconductor precursor material but lower than the decomposition temperature of the seed material for sufficient time to decompose the precursor material. The assembly is then gradually cooled to a temperature at which the bulk precursor material has solidified completely, and is then further cooled to room temperature.

(RE1)$Ba_2Cu_3O_x$ seeds are then fabricated by cutting along the <100> directions of the single domain. Bulk (RE2)$Ba_2Cu_3O_x$ superconductor precursor material having a decomposition temperature higher than the (RE1)$Ba_2Cu_3O_x$ seed material is then prepared. An assembly is then formed by placing the (RE1)$Ba_2Cu_3O_x$ seed material in intimate contact with the (RE2)$Ba_2Cu_3O_x$ superconductor precursor material in an arrangement whereby the relative misorientation between individual seeds is less than 15°, and preferably less than 5°, and whereby the subsequent growth front of each domain will impinge along the direction normal to the (100) or (010) planes; that is the [100] or [010] central axes of neighboring seeds shall be as collinear as possible such that the resultant domain boundaries are parallel to the (100) or (010) planes. The assembly is then heated to a temperature higher than the decomposition temperature of the (RE2)$Ba_2Cu_3O_x$ superconductor precursor material but lower than the decomposition of the seed/s material; for sufficient time to decompose the precursor material. The assembly is then gradually cooled to a temperature at which the bulk precursor material has solidified completely, then the assembly is further cooled to room temperature. Finally, the assembly is treated in an oxidizing atmosphere to obtain a bulk superconductor of (RE2)$Ba_2Cu_3O_x$.

Formation of Strongly-linked Low-angle Domain Boundaries

The entire assembly, including the seed arrangement, the bulk superconductor with or without the porous substrate support, and any other strengthening substrate support material, is introduced into a furnace and heated to a temperature higher than the decomposition temperature of (RE2)$Ba_2Cu_3O_x$, considering additions, such as Pt and/or (RE2)$_2BaCuO_5$.

For example, if the seed material is $SmBa_2Cu_3O_x$ having a decomposition temperature of approximately 1060° C. in air, the bulk superconducting precursor to be textured can be $YBa_2Cu_3O_x$ (decomposition temperature is approximately 1010° C. in air), $YbBa_2Cu_3O_x$ (decomposition temperature is approximately 965° C. in air), or a mixture of $YBa_2Cu_3O_x$ and $YbBa_2Cu_3O_x$ (decomposition temperature will be between 1010° C. and 965° C. in air). Additions such as Pt or $Y_2BaCuO_5$ also can be added to the superconductor precursor material. If additions are made, a partial melting temperature of at least 1015° C. should be used for $YBa_2Cu_3O_x$ precursor as well as $YbBa_2Cu_3O_x$ precursor with Pt and/or $Y_2BaCuO_5$ additions. A temperature of at least 970° C. should be used for $YbBa_2Cu_3O_x$ precursor as well as $YbBa_2Cu_3O_x$ precursor with Pt and/or $Yb_2BaCuO_5$ additions.

The assembly is held at this temperature until the seeds are placed on the superconductor precursor material after melting, but before solidification is initiated if method (3) described above is used for placing the seeds in contact with the precursor material.

The superconductor is then slowly cooled at a rate of 0.5° C./h to 10° C./h, preferably less than 2° C./h, with or without the presence of a temperature gradient until the bulk has completely solidified. Then, the assembly is cooled to room temperature with either an annealing step during cooling or at a later time to enable oxygen uptake.

EXAMPLES

The following experimental details are referenced in the specific Examples that follow:

Example I

Figure 9:
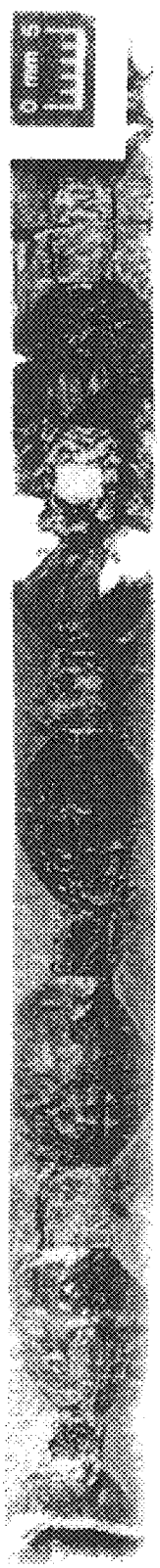
FIG. 9 is a photograph showing a $YBa_2Cu_3O_x$ current lead element with $SmBa_2Cu_3O_x$ seeds in accordance with the method described in Example I.

Fabrication of Bearing Elements and Current Leads $YBa_2Cu_3O_x$ bearing and current lead elements can be fabricated by the process described above as follows. $YBa_2Cu_3O_x$ superconductor precursor material will first be formed by simple pressing to form a bulk material. The bulk $YBa_2Cu_3O_x$ precursor material is then pre-sintered at 925° C. for densification. $SmBa_2Cu_3O_x$ seeds are then placed on the surface of the superconductor precursor material in an appropriate arrangement as shown in FIGS. 3a or b to form a precursor material/seed assembly. The assembly is then placed on a porous $Y_2BaCuO_5$ substrate which weighs 30–50% of that of the bulk sample. The entire assembly is introduced into a furnace and is heated to 1030° C. After holding at this temperature for approximately 1 hour, the assembly is cooled at a rate of 1° C./h until 950° C., and then cooled at 10° C./h to room temperature. A photo of bearing element fabricated in this fashion is shown in FIG. 8. FIG. 9 shows a photo of a current lead element produced using the identical procedure with an appropriate seed arrangement as illustrated in FIG. 3b.

Figure 10:
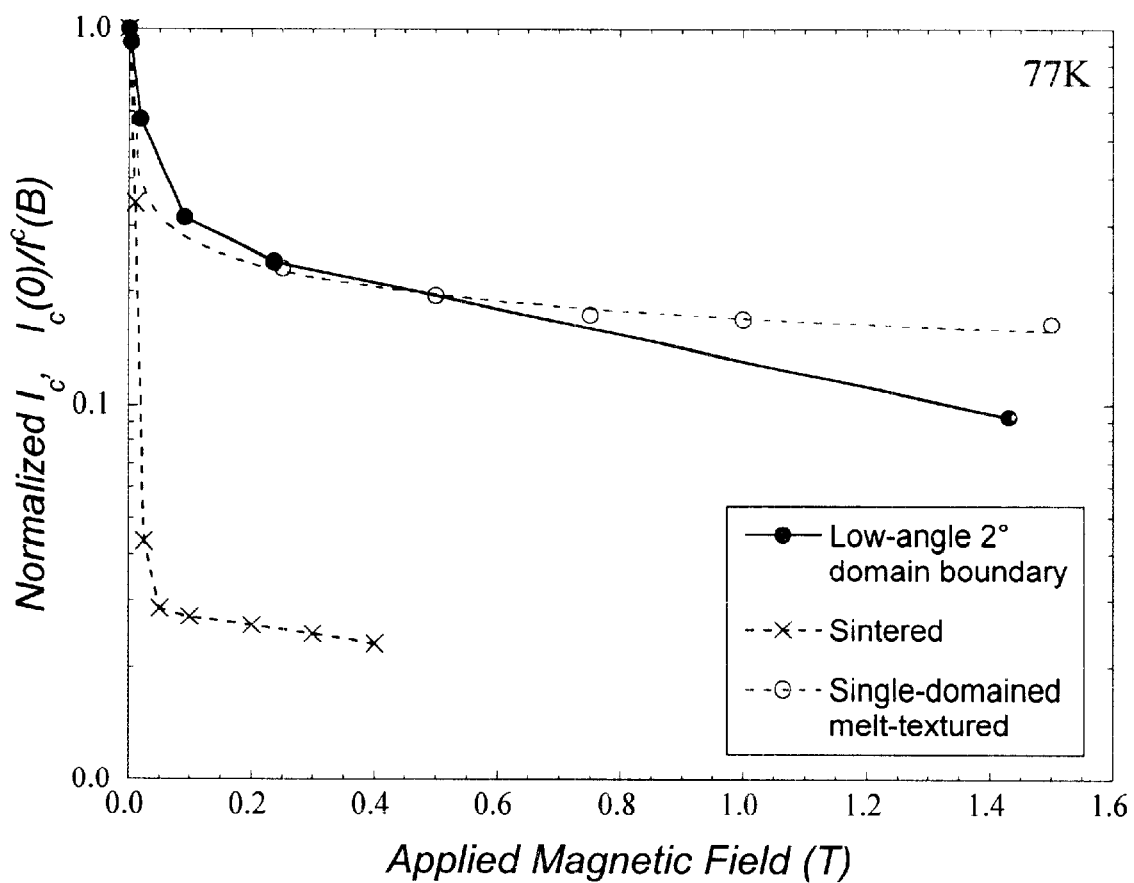
FIG. 10 shows the variation in normalized transport critical current density with magnetic field across a low angle strongly-linked domain boundary of a current lead element in accordance with the method described in Example I. Also included are the transport current density characteristics of a single-domained melt-textured $YBa_2Cu_3O_x$ and a weakly-linked sintered $YBa_2Cu_3O_x$.

A bulk sample containing one low-angle domain boundary is cut from the current lead element shown in FIG. 9. Transport critical current density measurement performed on this boundary shows a critical current density of at least 5,800 A/cm$^2$ at 77K and self field. FIG. 10 shows the variation in normalized transport critical current density with magnetic field of this low-angle domain boundary together with the transport current density characteristics of a single-domained melt-textured $YBa_2Cu_3O_x$ and a weakly-linked sintered $YBa_2Cu_3O_x$. It can be seen from this FIG. 10 that the magnetic field dependency of the low-angle domain boundary is similar to the single-domained melt-textured superconductor, thereby affirming that the low-angle domain boundary is strongly linked. In contrast, the transport critical current density of the sintered material degrades rapidly with applied magnetic field to vanishing small values in less than 100 mT.

Example II

Methods for Placing Seeds in Contact with the Superconductor Precursor Material

As discussed above, seeds materials may be brought into intimate contact with the superconductor precursor material by at least one of the following methods: (1) seeds are embedded into the superconductor precursor material during formation of the superconductor precursor material; (2) seeds are placed on the superconductor precursor material before melt processing; or (3) seeds are placed on the superconductor precursor material after melting, but before solidification is initiated.

(Method (1))

For example in one embodiment method, method (1), square-shaped single-domained melt-textured $SmBa_2Cu_3O_x$ seeds are arranged within a die in an arrangement where the misorientation angle between the [100] or [010] axes of adjacent seeds is less than 5° and the [100] or [010] central axes of adjacent seeds are co-linear as shown schematically in FIG. 3b. $YBa_2Cu_3O_x$ precursor powder is carefully poured onto the seeds without disturbing the seed arrangement. Pressure is then applied to form a rectangular precursor bar with the seeds embedded within the bulk material. The bulk precursor bar is then placed on top of a porous substrate comprised of $Y_2BaCuO_5$ particles.

The assembly which includes the $Y_2BaCuO_5$ substrate and the $SmBa_2Cu_3O_x$ seeds embedded within the $YBa_2Cu_3O_x$ precursor bar is introduced into a box furnace. The temperature is then increased to 925° C. at a rate of 60° C./h and held at that temperature for 12 h to densify the precursor bar. After densification, the temperature is raised to 1030° C. at 300° C./h and held at that temperature for 30 min to allow the $YBa_2Cu_3O_x$ precursor to decompose. Then, the assembly is slowly cooled at a rate of 1° C./h to 950° C. with or without the presence of a temperature gradient. Seeded growth occurs during this slow cooling step resulting in a bulk quasi-single domained $YBa_2Cu_3O_x$ material. Once a temperature of 950° C. is reached, the temperature is lowered to room temperature at a rate of 60° C./h with either an annealing step during cooling or at a later time to enable oxygen uptake.

(Method (2))

In one embodiment of method (2), $YBa_2Cu_3O_x$ precursor powder is poured into a die, and pressure is applied to form a circular disk. The disk is then sintered at 925° C. in a box furnace at a ramp up rate of 60° C./h and held at that temperature for 12 h. After densification, the bulk $YBa_2Cu_3O_x$ disk is cooled to room temperature at a rate of 60° C./h. The sintered $YBa_2Cu_3O_x$ disk is then placed on top of a porous $Y_2BaCuO_5$ substrate, and square-shaped single-domained melt-textured $SmBa_2Cu_3O_x$ seeds are arranged on top of the $YBa_2Cu_3O_x$ disk in an arrangement where the misorientation angle between the [100] or [010] axes of adjacent seeds is less than 5° and the [100] or [010] central axes of adjacent seeds are co-linear as shown schematically in FIG. 3a.

The assembly which includes the $Y_2BaCuO_5$ substrate, the $YBa_2Cu_3O_x$ disk and the $SmBa_2Cu_3O_x$ seeds is introduced into a box furnace. The temperature is then increased to 1030° C. at a rate of 300° C./h and held at that temperature for 30 min to allow the $YBa_2Cu_3O_x$ to decompose. Then, the assembly is slowly cooled at a rate of 1° C./h to 950° C. with or without the presence of a temperature gradient. Seeded growth occurs during this slow cooling step resulting in a bulk quasi-single domained $YBa_2Cu_3O_x$ material. Once a temperature of 950° C. is reached, the temperature is lowered to room temperature at a rate of 60° C./h with either an annealing step during cooling or at a later time to enable oxygen uptake.

(Method (3))

In one embodiment of method 3, $YbBa_2Cu_3O_x$ precursor powder is poured into a die, and pressure is applied to form a rectangular bar. The bar is then placed on top of a porous $Yb_2BaCuO_5$ substrate and sintered at 890° C. in a box furnace at a ramp up rate of 60° C./h and held at that temperature for 12 h. After densification, the bulk $YbBa_2Cu_3O_x$ bar is heated to 990° C. at a rate of 300° C./h and held at that temperature for 30 min to allow the $YbBa_2Cu_3O_x$ to decompose.

Square-shaped single-domained melt-textured $YBa_2Cu_3O_x$ seeds prearranged in a pattern where the misorientation angle between the [100] or [010] axes of adjacent seeds is less than 5 and the [100] or [010] central axes of adjacent seeds are co-linear as shown schematically in FIG. 3b are lowered onto the decomposed bulk $YbBa_2Cu_3O_x$ bar through an opening at the top of the furnace. The assembly which includes the $Yb_2BaCuO_5$ substrate, the decomposed $YbBa_2Cu_3O_x$ bar and the $YBa_2Cu_3O_x$ seeds is then slowly cooled at a rate of 1° C./h to 900° C. with or without the presence of a temperature gradient. Seeded growth occurs during this slow cooling step resulting in a bulk quasi-single domained $YbBa_2Cu_3O_x$ material. Once a temperature of 900° C. is reached, the temperature is lowered to room temperature at a rate of 60° C./h with either an annealing step during cooling or at a later time to enable oxygen uptake.

Example III

Fabrication of $YbBa_2Cu_3O_x$ by Sequential Multiple Seeding

Quasi-single domained bulk $YbBa_2Cu_3O_x$ elements with low angle domain boundaries can be fabricated by the process described above as follows. In this example, a bulk $SmBa_2Cu_3O_x$ precursor material is partially melted at 1100° C. for 1 h in a box furnace. The temperature is then lowered at 60° C./h to 1070° C. where slow cooling at a rate of 1° C./h commences. After the temperature has reached 1020° C., the melt-textured $SmBa_2Cu_3O_x$ is cooled to room temperature within the furnace. A single-domained $SmBa_2Cu_3O_x$ is cut from the bulk material, and a seed is obtained by cleaving.

After producing the $SmBa_2Cu_3O_x$ seed, a bulk $YBa_2Cu_3O_x$ disc of 1 inch diameter is formed by pressing. The $YBa_2Cu_3O_x$ disc is then sintered in a box furnace at 925° C. for 12 h with ramp up and ramp down rates of 60° C./h. The cleaved a-b plane surface, i.e. the (001) plane, of the $SmBa_2Cu_3O_x$ seed is placed on top of the $YBa_2Cu_3O_x$ disc at room temperature, and the assembly is heated to 1030° C. at a rate of 300° C./h in a box furnace. After holding for 1 h, the temperature is lowered to 950° C. at a rate of 1° C./h, and then cooled at 60° C./h to room temperature. At this point, the seeded $YBa_2Cu_3O_x$ domain is in the shape of a tetragon with its sides parallel to the (100) or (010) planes and the a-b planes parallel to the surface of the disc. The single $YBa_2Cu_3O_x$ domain is extracted from the bulk by cutting along the edges of the domain (i.e. along the <100> directions), and large $YBa_2Cu_3O_x$ seeds are obtained by further slicing along the a-b planes.

Figure 11:
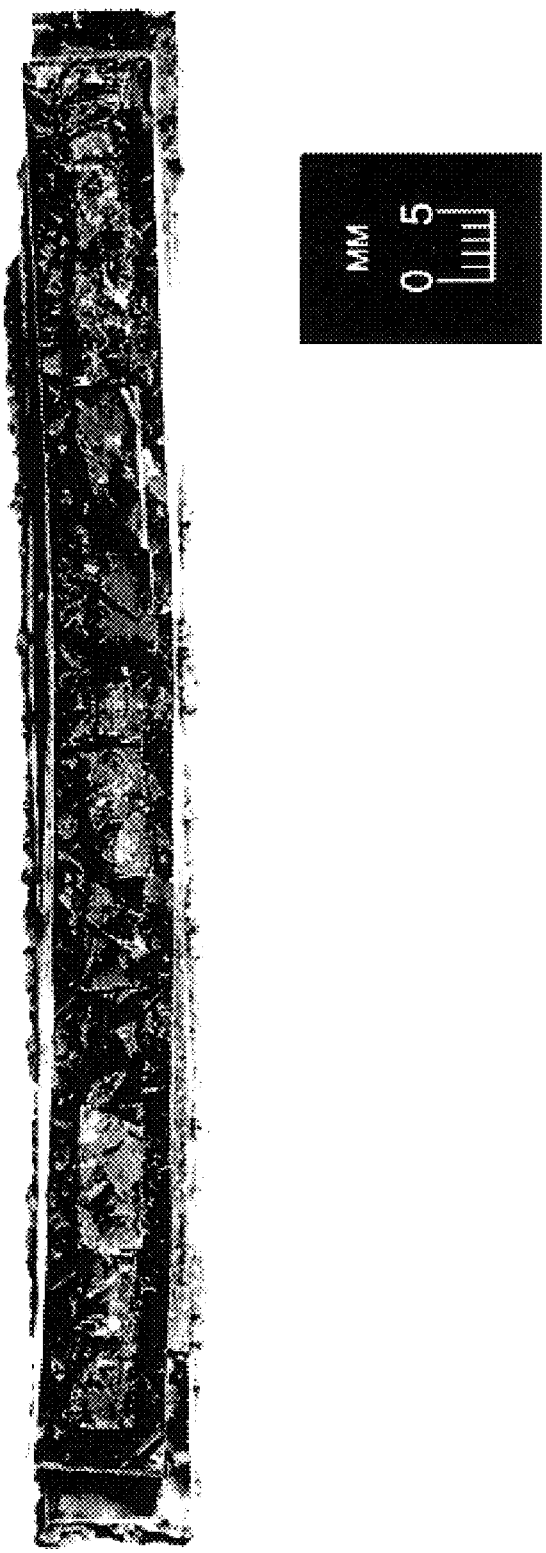
FIG. 11 is a photograph showing a $YbBa_2Cu_3O_x$ current lead element with $YbBa_2Cu_3O_x$ seeds in accordance with the method described in Example III.

Once the $YBa_2Cu_3O_x$ seeds have been fabricated, a bulk $YbBa_2Cu_3O_x$ bar is formed by pressing and then pre-sintered in a box furnace at 890° C. for 12 h with ramp up and ramp down rates of 60° C./h. The sintered $YbBa_2Cu_3O_x$ bar is then placed on top of a thin $Yb_2BaCuO_5$ substrate which rests on a thin $Al_2O_3$ bar. Multiple $YBa_2Cu_3O_x$ seeds are placed on top of the $YbBa_2Cu_3O_x$ bar at room temperature in an end-to-end arrangement as shown schematically in FIG. 4c, with misorientation angles between the [100] or [010] axes of adjacent seeds of less than 5° and the [100] or [010] central axes of adjacent seeds being co-linear. The entire assembly is then heated to 990° C. at a rate of 300° C./h in a box furnace. After holding for 30 min, the assembly is cooled to 900° C. at a rate of 1° C./h, and to room temperature at 60° C./h. A photo of a current lead element fabricated in this fashion is shown in FIG. 11.

Example IV

Seeding of $YBa_2Cu_3O_x$ by Textured RABiTS Substrates

Quasi-single domained bulk $YBa_2Cu_3O_x$ elements with low angle domain boundaries can also be fabricated by the process described above as follows. In this example, a textured RABiTS substrate is prepared by first rolling a Ni rod into a 125 μm thick foil at approximately 20% reduction per pass. Following rolling, the as-rolled Ni foil is recrystallized at 800° C. for 2 h in vacuum, at which point a cube texture is developed. Once the textured Ni foil has been obtained, it is heated to 650° C. in an Ar—4%H$_2$ atmosphere within an electron beam evaporation chamber.

The sample is held for 1 h before the temperature is reduced to 600° C., and a 400 Å thick epitaxial CeO$_2$ buffer layer is deposited onto the Ni surface. After the CeO$_2$ has been deposited, the buffered Ni is transferred into a rf-sputtering chamber and heated to 780° C. in an Ar—4%H$_2$ atmosphere. After holding for 10 min., a 5000 Å thick epitaxial YSZ buffer is sputtered onto the CeO$_2$ buffer, and the textured RABiTS substrate (YSZ/CeO$_2$/Ni) is cooled to room temperature. In order to fabricate the seeded bulk superconductor, a sintered YBa$_2$Cu$_3$O$_x$ bar is placed on top of a thin Y$_2$BaCuO$_5$ substrate. The RABiTS substrate is placed on top of the YBa$_2$Cu$_3$O$_x$ bar at room temperature with the YSZ in intimate contact with the YBa$_2$Cu$_3$O$_x$ surface. The entire assembly is then heated to 1030° C. in a box furnace at 300° C./h for partial melting. After holding for 1 h, the temperature is lowered to 950° C. at a rate of 1° C./h, and then cooled at 60° C./h to room temperature.

Example V

Seeding of YBa$_2$Cu$_3$O$_x$ by Thick Film SmBa$_2$Cu$_3$O$_x$ Deposited on Textured RABiTS Substrates Bulk YBa$_2$Cu$_3$O$_x$ elements consisted of low angle domain boundaries can also be fabricated by the process described above as follows. In this example, textured RABiTS substrate is prepared in an identical fashion as described above in Example IV. Once the textured substrate has been fabricated, it is transferred into a pulsed-laser deposition chamber and heated to 780° C. in an argon-4%hydrogen atmosphere and held for 10 min. Then, the atmosphere is switched to 200 mTorr oxygen, and an epitaxial thick film SmBa$_2$Cu$_3$O$_x$ of greater than 5 μm thickness is deposited onto the YSZ buffer using an excimer laser operating at 3 J/cm$^2$ and 2 Hz. A sintered YBa$_2$Cu$_3$O$_x$ bar is placed on top of a thin Y$_2$BaCuO$_5$ substrate. The SmBa$_2$Cu$_3$O$_x$ on RABiTS substrate is placed on top of the YBa$_2$Cu$_3$O$_x$ bar at room temperature with the SmBa$_2$Cu$_3$O$_x$ in intimate contact with the YBa$_2$Cu$_3$O$_x$ surface. The assembly is then heated to 1030° C. in a box furnace at a ramp rate of 300° C./h. After holding for 1 h, the temperature is lowered to 950° C. at a rate of 1° C./h, and then cooled at 60° C./h to room temperature.

INDUSTRIAL APPLICABILITY

Large single domained or quasi-single domained REBa$_2$Cu$_3$O$_x$ are expected to be essential components in a number of applications. These include bearing materials for energy storage devices such as flywheels as well as current leads for superconducting magnets and magnetic resonance imaging machines (MRI).

Energy storage devices are attractive to power utilities due to the dramatic growth in electrical energy consumption. As a result, these utilities are required to produce an ever increasing output during peak hours to satisfy the energy demand of industries and households. Associated with this increasing energy output is the need for effective load leveling. One potential strategy to meet this need is through the usage of energy storage flywheels. The power plants will then be able to maintain a leveled production schedule where excess output during low demand periods is stored in the flywheels, and the excess power is later extracted for consumption during peak hours.

One means by which storage losses can be reduced is by employing magnetic bearings, where REBa$_2$Cu$_3$O$_x$ is uniquely suited because of its high flux pinning capability at high temperatures. In operating flywheel storage units, multiple bearing elements are needed for each flywheel, and thousands of flywheels are needed at each plant such that the potential demand for the superconducting element is substantial.

In addition to providing excellent bearing materials, REBa$_2$Cu$_3$O$_x$ is also a leading candidate as current lead components in conventional superconducting magnets which are found in MRI, and superconducting magnet energy storage (SMES) systems at industries and research institutions. In conventional superconducting systems, current is supplied to the superconductor through normal metallic current leads. Due to joule heating as well as thermal conduction, significant losses in the form of liquid cryogen boil-off or refrigeration power consumption are incurred. The use of high temperature superconductor current lead will eliminate the joule heating and drastically reduce the losses through thermal conduction, and represents a near-term application of high temperature superconductors with the potential for significant savings and demands.

This invention is not limited by the examples set forth above. Obviously, numerous modifications and variations of the present invention are possible in light of the above teachings. It is therefore to be understood that within the scope of the appended claims, the invention may be practiced otherwise than as specifically described herein.

What is claimed is:

1. A method for depositing a REBa$_2$Cu$_3$O$_x$ film on a textured buffer layer using solution reagents, said textured buffer layer disposed on a metallic substrate, comprising the steps of:

coating a REBa$_2$Cu$_3$O$_x$ precursor solution onto said textured buffer layer;

heating said coated substrate in a partial oxygen atmosphere to react said REBa$_2$Cu$_3$O$_x$ precursor solution to form an epitaxial layer of said REBa$_2$Cu$_3$O$_x$ on said textured buffer layer;

wherein said REBa$_2$Cu$_3$O$_x$ has a crystal orientation which is approximately identical to the crystal orientation of said textured buffer on said metallic substrate.

2. The method of claim 1, wherein said REBa$_2$Cu$_3$O$_x$ film on said textured buffer on said metallic substrate is produced by the following steps:

mechanically deforming a metallic substrate having a random crystal orientation by rolling or pressing;

recrystallizing said metallic substrate such that said metallic substrate is highly textured with substantial amount of grains possessing a grain-to-grain misorientation of less than 15° between the [100] or [010] or [001] axes;

depositing at least one buffer layer on said metallic substrate such that said buffer layer retains a crystal orientation approximately identical to the crystal orientation of said metallic substrate; and depositing a REBa$_2$Cu$_3$O$_x$ film on said buffer layer on said metallic substrate by the reaction of solutions such as sol-gel or metal-organic such that said REBa$_2$Cu$_3$O$_x$ film retains a crystal orientation approximately identical to the crystal orientation of said buffer layer on said metallic substrate.

3. The method of claim 2, wherein said buffer layer is comprised of a material selected from the group of Pd, Pt, Ag, $A_mO_n$, A-stabilized zirconia, $A_iTi_jO_k$ and $A_xAl_yO_z$ (where A=alkaline earth and rare earth).

4. The method of claim 3, wherein said depositing of said buffer layer is accomplished by physical vapor deposition, chemical vapor deposition, or the reaction of solutions such as sol-gel or metal-organic containing the appropriate amount and type of cations.

5. The method of claim 1, wherein said $REBa_2Cu_3O_x$ film on said textured buffer on said metallic substrate is produced by the following steps:

depositing a ceramic layer on a metallic substrate with an assisting ion beam positioned at an appropriate angle to eliminate any undesirable crystal orientation and produce a cube-textured ceramic layer having a crystal orientation with substantial amount of grains possessing a grain-to-grain misorientation of less than 15° between the [100] or [010] or [001] axes; and depositing a metallic or ceramic buffer layer onto said cube-textured ceramic layer by physical vapor deposition, chemical vapor deposition, or the reaction of solutions such as sol-gel or metal-organic containing the appropriate amount and type of cations such that the metallic of ceramic buffer layer has a crystal orientation substantially identical to the crystal orientation of said cube-textured ceramic layer; and depositing a $REBa_2Cu_3O_x$ film on said buffer layer by the reaction of solutions such as sol-gel or metal-organic such that said $REBa_2Cu_3O_x$ film retains a crystal orientation approximately identical to the crystal orientation of said buffer layer.

6. The method of claim 5, wherein said buffer layer is comprised of a material selected from the group of Pd, Pt, Ag, $A_mO_n$, A-stabilized zirconia, $A_iTi_jO_k$ and $A_xAl_yO_z$ (where A=alkaline earth and rare earth).

7. The method of claim 6, wherein said deposition of said buffer layer is accomplished by physical vapor deposition, chemical vapor deposition, or the reaction of solutions such as sol-gel or metal-organic containing the appropriate amount and type of cations.

8. The method of claim 1, wherein said heating step is performed in a partial oxygen atmosphere.

9. The method of claim 8, wherein said partial oxygen atmosphere is humidified.

10. The method of claim 1, wherein said $REBa_2Cu_3O_x$ precursor solution comprises trifluoroacetate (TFA).

11. The method of claim 10, wherein said heating step is performed in a humidified atmosphere.

12. The method of claim 1, wherein said coating comprises at least one selected from the group consisting of spin coating and dip coating.

13. A method for depositing an epitaxial $REBa_2Cu_3O_x$ film on a textured buffer layer using solution reagents, said textured buffer layer disposed on a metallic substrate, comprising the steps of:

coating a $REBa_2Cu_3O_x$ precursor solution onto said textured buffer layer;

drying said $REBa_2Cu_3O_x$ precursor solution; and heating said coated substrate having said dried $REBa_2Cu_3O_x$ precursor in a partial oxygen atmosphere to form an epitaxial layer of said $REBa_2Cu_3O_x$ on said textured buffer layer;

wherein said $REBa_2Cu_3O_x$ has a crystal orientation which is approximately identical to the crystal orientation of said textured buffer on said metallic substrate.

14. The method of claim 13, wherein said $REBa_2Cu_3O_x$ precursor solution comprises a sol-gel or metal-organic.

15. The method of claim 14, wherein said drying step comprises a heat treatment at a temperature of no more than 450° C. in a partial oxygen atmosphere.

16. The method of claim 13, wherein said heating step is performed in a humidified atmosphere.

17. The method of claim 13, wherein said $REBa_2Cu_3O_x$ precursor solution comprises trifluoroacetate (TFA).

18. The method of claim 17, wherein said heating step is performed in a humidified atmosphere.

* * * * *